US012093342B2

(12) United States Patent
Wang (10) Patent No.: US 12,093,342 B2
(45) Date of Patent: Sep. 17, 2024

(54) DYNAMIC BIAS ANALOG VECTOR-MATRIX MULTIPLICATION OPERATION CIRCUIT AND OPERATION CONTROL METHOD THEREFOR

(71) Applicant: BELJING ZHICUN (WITIN) TECHNOLOGY CORPORATION LIMITED, Beijing (CN)

(72) Inventor: Shaodi Wang, Beijing (CN)

(73) Assignee: BELJING ZHICUN (WITIN) TECHNOLOGY CORPORATION LIMITED, Beijing (CN)

( * ) Notice: Subject to any disclaimer, the term of this patent is extended or adjusted under 35 U.S.C. 154(b) by 385 days.

(21) Appl. No.: 17/434,099

(22) PCT Filed: Apr. 3, 2019

(86) PCT No.: PCT/CN2019/081337
§ 371 (c)(1),
(2) Date: Aug. 26, 2021

(87) PCT Pub. No.: WO2020/172950
PCT Pub. Date: Sep. 3, 2020

(65) Prior Publication Data
US 2022/0137924 A1    May 5, 2022

(30) Foreign Application Priority Data
Feb. 26, 2019 (CN) .......................... 201910143504.1

(51) Int. Cl.
*G06F 17/16*   (2006.01)
*G06G 7/16*   (2006.01)
(52) U.S. Cl.
CPC ............. *G06F 17/16* (2013.01); *G06G 7/16* (2013.01)

(58) Field of Classification Search
CPC ......................... G06F 17/15–153; G06G 7/16
See application file for complete search history.

(56) References Cited

U.S. PATENT DOCUMENTS

2014/0172937 A1*  6/2014  Linderman ............ G06G 7/16
708/607

FOREIGN PATENT DOCUMENTS

CN      102969995 B     5/2015
CN      209514618 U  * 10/2019  ............ G06F 17/16
(Continued)

*Primary Examiner* — Matthew D Sandifer (57) ABSTRACT

A dynamic bias analog vector-matrix multiplication operation circuit comprises: positive value weight columns ($10_1$-$10_N$), constant columns ($20_1$-$20_M$) and subtractors ($30_1$-$30_N$), wherein the number of the subtractors is equal to the number of the positive value weight columns, the subtractors are correspondingly connected to the positive value weight columns on a one-to-one basis, and the number of the constant columns is less than the number of the positive value weight columns; minuend input ends of the subtractors are correspondingly connected to output ends of the positive value weight columns, subtrahend input ends of a plurality of subtractors are connected to the same constant column, and output ends thereof output operation results. Before a weight is written in a programmable semiconductor device, a constant positive value is added to each element in a weight array, the weight array is written in a positive value weight column, and the constant positive value is written in a constant column. Therefore, a negative value weight column does not need to be set, such that the circuit structure can be simplified.

7 Claims, 5 Drawing Sheets

(56) References Cited

FOREIGN PATENT DOCUMENTS

| | | | | |
|---|---|---|---|---|
| CN | 209657299 | U | * | 11/2019 |
| CN | 111128279 | A | * | 5/2020 |
| CN | 111949935 | A | * | 11/2020 |
| CN | 112865727 | A | | 5/2021 |
| CN | 213847079 | U | | 7/2021 |

* cited by examiner

FIG.1

(Prior Art)

DYNAMIC BIAS ANALOG VECTOR-MATRIX MULTIPLICATION OPERATION CIRCUIT AND OPERATION CONTROL METHOD THEREFOR

CROSS REFERENCE TO RELATED APPLICATION

This application claims the priority of a Chinese patent application filed with the Chinese Patent Office with an application number of 201910143504.1 on Feb. 26, 2019, the name of the application is "DYNAMIC BIAS ANALOG VECTOR-MATRIX MULTIPLICATION OPERATION CIRCUIT AND OPERATION CONTROL METHOD THEREFOR", the entire content of which is incorporated into this application by reference.

BACKGROUND

The invention relates to the field of semiconductor integrated circuits, in particular to a dynamic bias analog vector-matrix multiplication circuit and its operation control method.

Matrix multiplication is widely used in data mining fields such as image processing, recommendation systems, data dimensionality reduction, etc. However, the traditional technical architecture and the serial-based approach of relying on a single computer are less and less suitable for the current requirements of massive data processing. Therefore, expanding the calculation scale of matrix multiplication and reducing its calculation time will help meet the requirements of matrix factorization algorithms for processing large-scale data.

Figure 1:
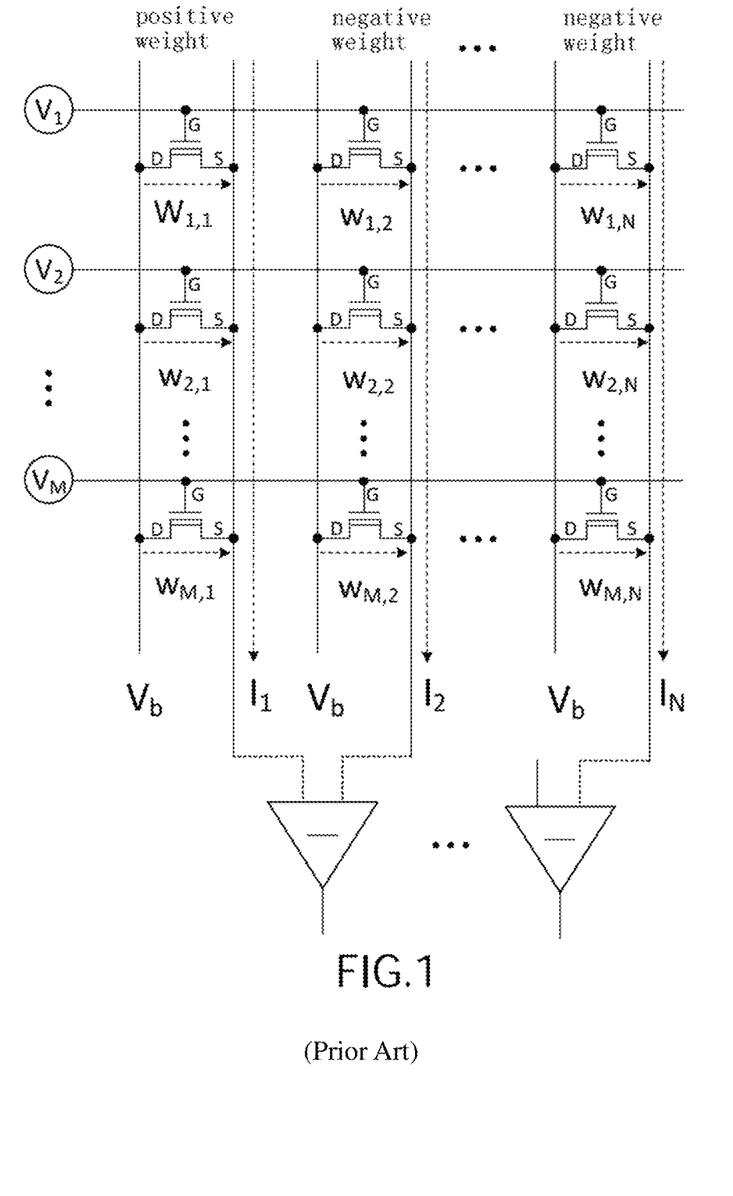
FIG. 1 is a circuit structure diagram of an existing analog vector-matrix multiplication circuit.

However, the existing analog vector-matrix multiplication circuit (shown in FIG. 1) stores the weights in the flash transistor array. In practical applications, the weights of the analog vector-matrix multiplication have positive and negative values, but the flash transistors can only store positive weights. Therefore, for negative weights, it needs to be implemented by a subtraction circuit. At this time, the flash memory array needs to set multiple positive weight columns and multiple negative weight columns. Generally, positive weight columns and negative weight columns shall be set at intervals. For example, odd-numbered columns store positive weights, even-numbered columns store negative weights, or vice versa. A positive weight column and a negative weight column are connected to a subtraction circuit to form a a weight column that can store both positive and negative values. This method greatly causes area waste and cost overhead.

SUMMARY

In view of this, the present invention provides a dynamic bias analog vector-matrix multiplication circuit and its operation control method, which can simplify the circuit structure, effectively reduce the number of components, reduce the circuit area, reduce the cost and overhead, and facilitate integration.

In order to achieve the above objectives, the present invention adopts the following technical solutions:

In the first aspect, a dynamic bias analog vector-matrix multiplication circuit is provided, comprising: a programmable semiconductor device array and subtractors;

the programmable semiconductor device array comprising: positive weight columns and constant columns, the number of the subtractors is equal to the number of the positive weight column and both are connected in one-to-one correspondence, the number of the constant column is less than the number of the positive weight column;

wherein the constant column can be one column or duplicate multiple columns;

the minute input terminal of the subtractor is connected to the output terminal of the positive weight column, the minus input terminal is connected to the output terminal of the constant column, and the output terminal outputs the result of the analog vector-matrix multiplication operation;

the minus input terminals of multiple subtractors are connected to the same constant column.

Further, the dynamic bias analog vector-matrix multiplication operation circuit further comprising: a steady current module, and said steady current module is connected to the output terminal of the constant column.

Further, the dynamic bias analog vector-matrix multiplication circuit further comprising:

a programming circuit connected to the source, gate and/or substrate of each programmable semiconductor device in the programmable semiconductor device array for adjusting the threshold voltage of the programmable semiconductor device.

Further, the programming circuit comprising: a voltage generating circuit and a voltage control circuit, the voltage generating circuit is used to generate a programming voltage or an erasing voltage, the voltage control circuit is used to load the programming voltage to the source of the selected programmable semiconductor device, or to load the erase voltage to the gate or the substrate of the selected programmable semiconductor device to control the program the threshold voltage of a semiconductor device.

Further, the dynamic bias analog vector-matrix multiplication circuit further comprises:

a controller connected to the programming circuit, and controlling the operation of the programming circuit to control the number of programmable semiconductor devices put into operation and the threshold voltage of each programmable semiconductor device.

Further, the dynamic bias analog vector-matrix multiplication operation circuit further comprising: a row and column decoder for gating the programmable semiconductor device to be programmed.

Further, the programmable semiconductor device uses floating gate transistors.

In the second aspect, an analog vector-matrix multiplication operation control method is provided, which is applied to the above-mentioned dynamic bias analog vector-matrix multiplication operation circuit, and the operation control method comprises:

obtaining a corresponding weight array according to the requirements of the simulated vector-matrix multiplication operation, wherein the weight array comprising negative weights and positive weights;

adding all the weight values in the weight array with a constant C to obtain a weight array to be configured, wherein the constant C is greater than or equal to the absolute value of the negative weight with the largest absolute value;

writing the weight array to be configured into the positive weight column, and write the constant C into the constant column.

The present invention provides a dynamic bias analog vector-matrix multiplication circuit and its operation control method. The programmable semiconductor device array of the dynamic bias analog vector-matrix multiplication circuit comprises: positive weight columns, constant columns and subtractors. The number of subtractors is equal to the number of positive weight columns and both are connected in one-to-one correspondence. The number of constant columns is less than the number of positive weight columns. The minuend input terminal of the subtractor is connected to the output terminal of the positive weight column, the subtrahend input terminal is connected to the output terminal of the constant column, and the output terminal outputs the operation result; wherein, the subtrahend input terminals of multiple subtractors are connected to the same constant column. Before writing the weight array to the programmable semiconductor device, a constant positive value is added to each element in the weight array to obtain the weight array to be configured, the positive value of the constant is greater than or equal to the absolute value of the negative weight with the largest absolute value in the weight array. In this way, there is no negative weight in the weight array to be configured; the weight array to be configured is written into the positive weight column, and the constant positive value is written into the constant column. The minuend input terminal of the subtractor is connected to the output terminal of the positive weight column, the subtrahend input terminal is connected to the output terminal of the constant column, and the output terminal outputs the operation result. Therefore, the effect of the positive value of the constant is subtracted from the operation result through the subtractor, so that there is no need to set a negative weight column, and multiple positive weight columns share a constant column, which can simplify the circuit structure, effectively reduce the number of components, reduce the circuit area, reduce cost, and facilitate integration.

In order to make the above and other objects, features and advantages of the present invention more comprehensible, the following will specifically cite preferred embodiments, in conjunction with the accompanying drawings, to describe in detail as follows.

BRIEF DESCRIPTION OF THE DRAWINGS

In order to explain the embodiments of the present invention or the technical solutions in the prior art more clearly, the following will briefly introduce the drawings that need to be used in the description of the embodiments or the prior art. [0056] Obviously, the drawings in the following description are some embodiments of the present application. For those of ordinary skill in the art, other drawings can be obtained based on these drawings without creative work, wherein.

DETAILED DESCRIPTION

The technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of the present invention.

The existing analog vector-matrix multiplication circuit sets multiple positive weight columns and multiple negative weight columns, which are used to store positive weights and negative weights, respectively. Generally, the positive weight column and the negative weight column need to be set at intervals. For example, odd-numbered columns store positive weights, and even-numbered columns store negative weights, or vice versa, according to the characteristics of programmable semiconductor devices: I=VW, I represents the output current, V represents the carrying voltage, W represents the weight of the programmable semiconductor device. Existing circuits usually change the above formula to I=(VW+)−(VW−), where W+ and W− represent the positive weight and negative weight respectively, and the positive weight column and the negative weight column are used to store the positive weight and negative weights, greatly causing area waste and cost overhead.

Figure 2:
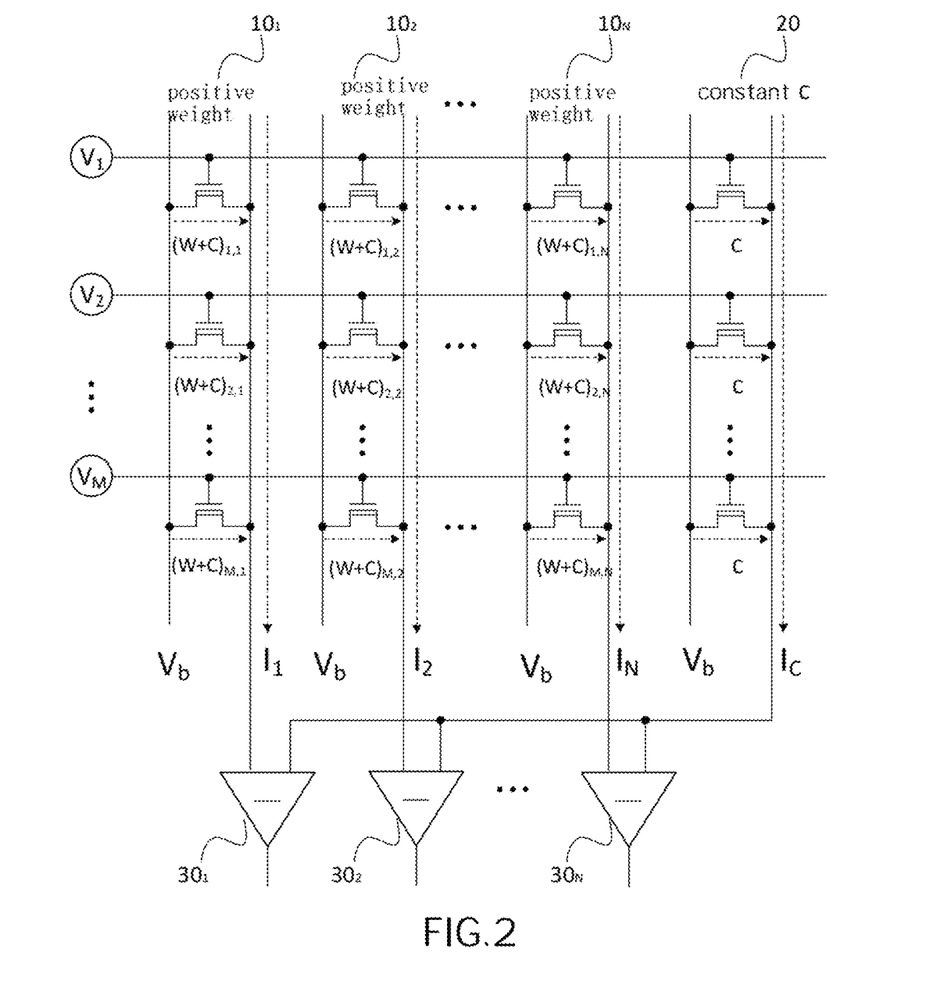
FIG. 2 is a circuit structure diagram 1 of a dynamic bias analog vector-matrix multiplication circuit according to an embodiment of the present invention.

In order to solve the above technical problems in the prior art, an embodiment of the present invention provides a dynamic bias analog vector-matrix multiplication circuit. As shown in FIG. 2, the dynamic bias analog vector-matrix multiplication circuit comprises: programmable semiconductor device array and subtractor $30_1 \sim 30_n$.

The programmable semiconductor device array comprises: positive weight columns $10_1 \sim 10_n$ and a constant column 20. The number of the subtractors $30_1 \sim 30_n$ is equal to the number of the positive weight column $10_1 \sim 10_n$ and both are connected in one-to-one correspondence. The number of the constant column 20 is less than the number of the positive weight columns $30_1 \sim 30_n$ (in this embodiment, the number of the constant column 20 is 1 to exemplify the solution of the present application).

The minuend input terminal of the subtractor is connected to the output terminal of the positive weight column, the subtrahend input terminal is connected to the output terminal of the constant column 20, and the output terminal outputs the calculation result;

wherein, the subtrahend input terminals of the multiple subtractors $30_1 \sim 30_n$ are connected to the same constant column 20.

wherein, the principle of the analog vector-matrix multiplication operation circuit to realize the analog vector-matrix multiplication operation is as follows: for a programmable semiconductor device array of M rows*N columns, the sources of all programmable semiconductor devices in each column are connected to the same analog voltage input terminal, N columns of programmable semiconductor devices are connected to N analog voltage input terminals correspondingly, and the gates of all programmable semiconductor devices in each row are connected to the same bias voltage input terminals, M rows of programmable semiconductor devices are correspondingly connected to M bias voltage input terminals, the drains of all programmable semiconductor devices in each column are connected to the same analog current output terminal, and N columns of programmable semiconductor devices are correspondingly connected to N analog current output terminals, wherein, the threshold voltage of each programmable semiconductor device can be adjusted. N is a positive integer greater than or equal to zero, and M is a positive integer greater than or equal to zero. M and N can be equal or unequal to form a topological structure of source coupling and drain summation.

wherein, by dynamically adjusting the threshold voltage $V_{TH}$ of each programmable semiconductor device according to certain rules in advance, each programmable semiconductor device can be regarded as a variable equivalent analog weight (denoted as $W_{k,j}$, wherein 0<k<M and 0<j<N represents the row number and column number respectively), it is equivalent to storing an analog data, and the programmable semiconductor device array stores an analog data array $$\begin{bmatrix} W_{1,1} & \cdots & W_{1,N} \\ \vdots & \ddots & \vdots \\ W_{M,1} & \cdots & W_{M,N} \end{bmatrix}.$$

When the circuit is working, one row of analog voltage signals $V_1 \sim V_N$ are respectively applied to N columns of programmable semiconductor devices, wherein, the sources of all programmable semiconductor devices in the Kth column get an analog voltage signal $V_k$, the gate inputs a bias voltage $V_b$, and the drain outputs current signals $I_{k,1} \sim I_{k,N}$ respectively, wherein, according to the characteristics of programmable semiconductor devices, I=V×W, the drain output current of each programmable semiconductor device is equal to the source voltage multiplied by the weight of the programmable semiconductor device, which is $I_{k,1}=V_k W_{k,1}$, $I_{k,N}=V_k W_{k,N}$, because the drains of all programmable semiconductor devices in each column are connected to the same analog current output terminal, according to Kirchhoff's law, therefore, the current $I_j$ at the analog current output terminal is the sum of the drain currents of all programmable semiconductor devices in the column, which is $I_j=\Sigma_{k=1}^{N} V_k W_{k,j}$, multiple analog current output terminals output the sum of multiple currents ($\Sigma_{k=1}^{N} V_k W_{k,1}$, $\Sigma_{k=1}^{N} V_k W_{k,2}$, $\Sigma_{k=1}^{N} V_k W_{k,3}$ ... $\Sigma_{k=1}^{N} V_k W_{k,N}$), realize the function of matrix multiplication operation.

Of course, the programmable semiconductor device array may also adopt a topological structure of gate coupling and source summation or a topological structure of gate coupling and drain summation, which is not limited in the embodiment of the present invention.

Hereinafter, the principle of implementing the subtraction operation by using the dynamic bias analog vector-matrix multiplication circuit of the embodiment of the present invention will be described:

Before writing the weight array to the programmable semiconductor device, add a constant positive value C to each element in the weight array to obtain the weight array to be configured, the positive value of the constant is greater than or equal to the absolute value of the negative weight with the largest absolute value in the weight array, in this way, there is no negative weight in the weight array to be configured; then, the weight array to be configured is written into the positive weight column, and the constant positive value is written into the constant column, the minuend input terminal of a subtractor is correspondingly connected to the output terminal of a positive weight column, the subtrahend input terminal is connected to the output terminal of a constant column, and the output terminal outputs the result of the analog vector-matrix multiplication operation. Therefore, the effect of the positive value of the constant is subtracted from the result of the operation by the subtractor. In this way, there is no need to set a negative weight column, and multiple positive weight columns share a constant column, which can simplify the circuit structure, effectively reduce the number of components, reduce the circuit area, reduce cost, and facilitate integration.

In the following, for a certain row, the weight is [5, −3, 6, −8] and the input voltage is V as an example to illustrate the principle of this application (in order to briefly explain the principle of this application, the simplest weight row is used as an example, in practical applications, the scale of the weight array depends on the calculation requirements. For deep neural network calculations, the weight array is often large in scale, and the advantages of the present invention are more obvious).

If the existing analog vector-matrix multiplication circuit is used, for this row, it is necessary to write 5 in the first positive weight transistor (corresponding to the first positive weight column), write 0 in the corresponding first negative weight transistor (corresponding to the first negative weight column), and output 5V after passing through the corresponding subtractor; write 0 in the second positive transistor, write −3 in the second negative value transistor, after passing the corresponding subtractor, output −3V; write 6 in the third positive value transistor, and write 0 in the third negative value transistor, after passing through the corresponding subtractor, output 6V; write 0 in the fourth positive transistor; write −8 in the fourth negative value transistor, after passing through the corresponding subtractor, output −8V; and then get the final result [5V, −3V, 6V, −8V], which requires 8 transistors in total.

Using the analog vector-matrix multiplication circuit provided by the embodiment of the present invention, firstly adding 9 to all weight values (more than or equal to 8) to obtain the weight column to be configured [14, 6, 15, 1]. Writing 14 in the first positive weight transistor (corresponding to the first positive weight column), writing 6 in the second positive transistor, writing 14 in the third positive transistor, and writing 1 in the fourth positive transistor, writing 9 in the constant transistor (corresponding to the constant column), after passing through the corresponding subtractor, outputting the final result [5V, −3V, 6V, −8V], a total of 5 transistors are needed to realize it. Compared with the prior art, the present invention effectively reduces the number of transistors by about 38%.

Those skilled in the art may understand that the larger the calculation scale, the more obvious the advantages of the present application is.

Figure 3:
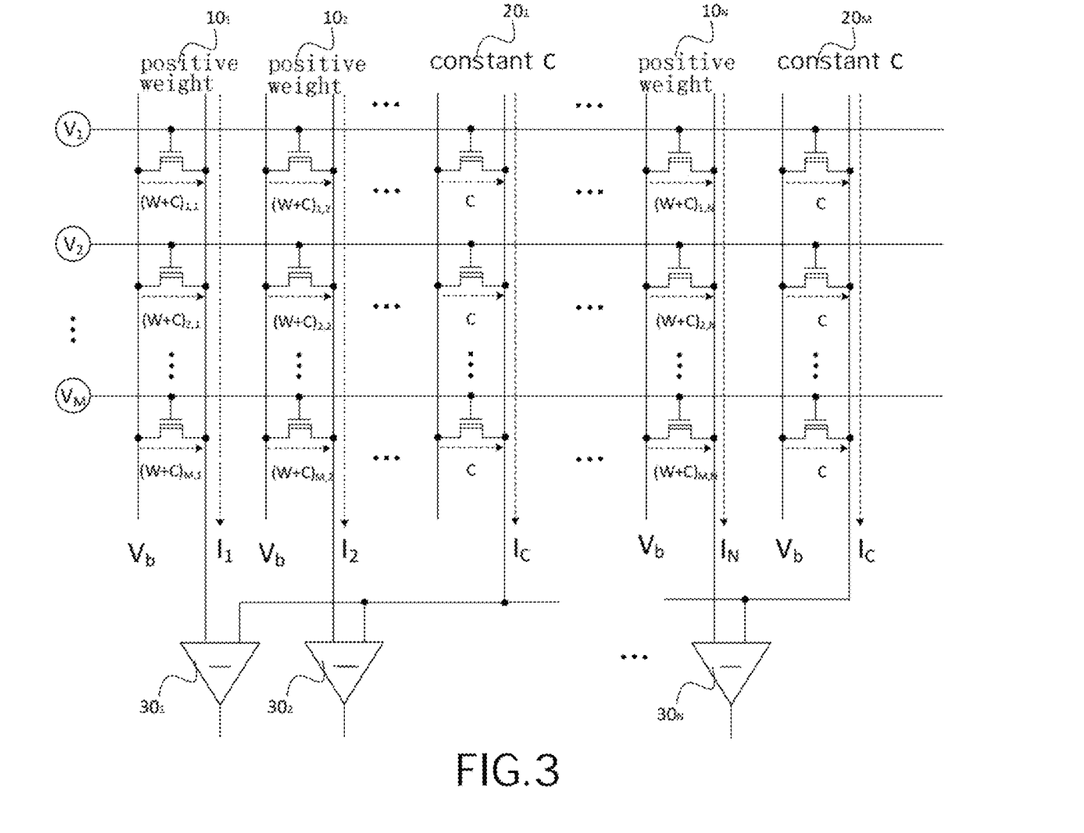
FIG. 3 is a circuit structure diagram 2 of a dynamic bias analog vector-matrix multiplication circuit according to an embodiment of the present invention.

In an alternative embodiment, referring to FIG. 3, the dynamic bias analog vector-matrix multiplication circuit can be provided with multiple constant columns, and the multiple constant columns can be divided equally or unequally across the entire programmable semiconductor device. When the programmable semiconductor device array is large, the number of columns of positive weight columns that share the constant column can be effectively reduced, so that the influence of parasitic parameters can be reduced, driving force, and circuit usage can be improved. The control can also be more flexible, and the accuracy and speed of the operation can be improved.

Those skilled in the art shall understand that when there are multiple constant columns, the weights of the constant columns can be set uniformly. In this case, the weight array is considered as a whole; It is also possible to combine each constant column with its corresponding positive weight column as an arithmetic unit. In practical applications, the weight array can be split into columns and then allocated to different arithmetic units. Each calculation unit sets the weight value of the constant column according to its own calculation task, and performs its own calculation, so that calculations can be realized more flexibly, and parallel processing of multiple calculation tasks can also be realized, which can effectively improve the speed and efficiency of calculations.

Figure 4:
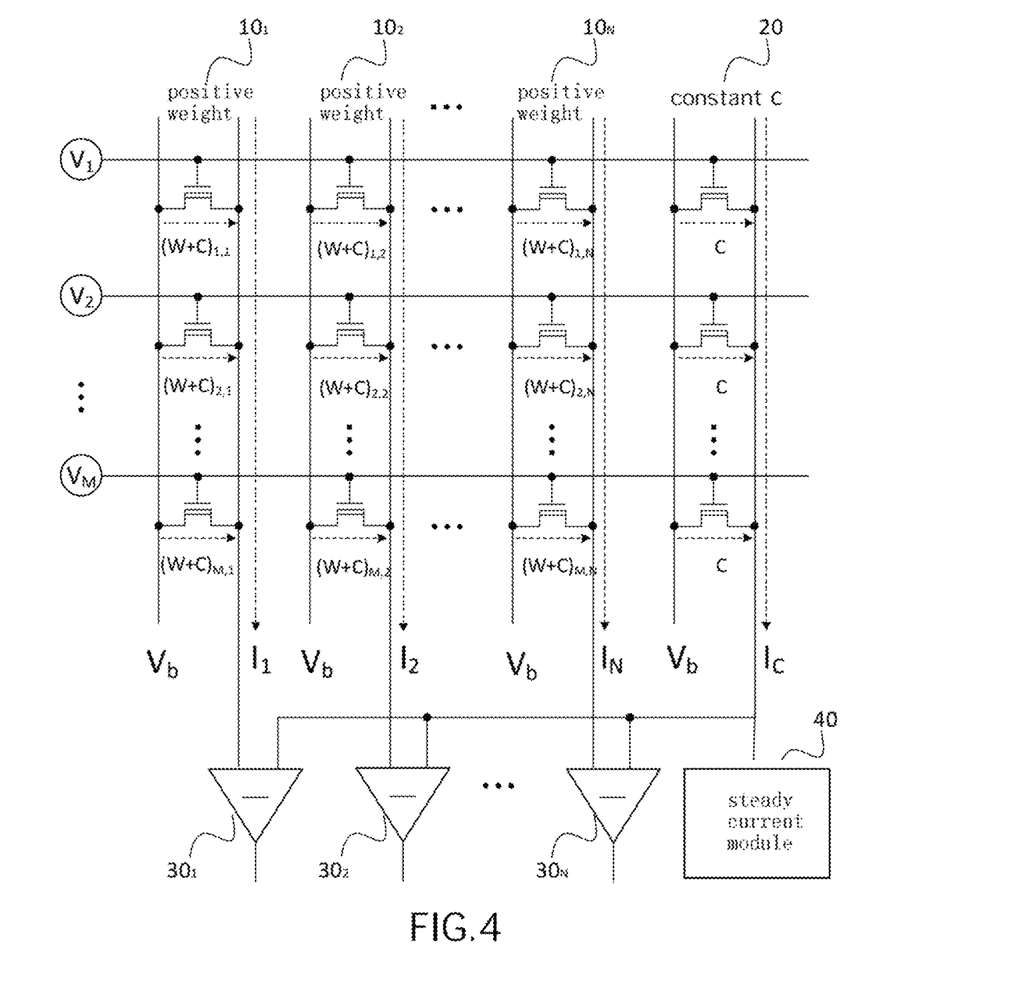
FIG. 4 is a circuit structure diagram 3 of a dynamic bias analog vector-matrix multiplication circuit according to an embodiment of the present invention.

In an optional embodiment, referring to FIG. 4, the dynamic bias analog vector-matrix multiplication circuit further comprises: a steady current module 40 connected to the output end of the constant column 20.

wherein, by setting the steady current module at the output end of the constant column 20, the influence of parasitic parameters can be effectively reduced, the driving force is further improved, and the accuracy and speed of calculation are improved.

In an optional embodiment, the dynamic bias analog vector-matrix multiplication circuit further comprises: a programming circuit connected to the source, gate and/or substrate of each programmable semiconductor device in the programmable semiconductor device array, used to regulate the threshold voltage of programmable semiconductor devices.

Wherein, the programming circuit may comprising: a voltage generating circuit and a voltage control circuit, the voltage generating circuit is used to generate a programming voltage or an erasing voltage, the voltage control circuit is used to apply the programming voltage to the source of the selected programmable semiconductor device, or to apply the erase voltage to the gate or the substrate of the selected programmable semiconductor device to adjust the threshold voltage of programmable semiconductor devices.

Specifically, the programming circuit uses the hot electron injection effect to apply a high voltage to the source of the programmable semiconductor device according to the threshold voltage requirement data of the programmable semiconductor device to accelerate the channel electrons to a high speed to increase the threshold voltage of the programmable semiconductor device.

In addition, the programming circuit uses the tunneling effect to apply a high voltage to the gate or the substrate of the programmable semiconductor device according to the threshold voltage requirement data of the programmable semiconductor device, thereby reducing the threshold voltage of the programmable semiconductor device.

In an optional embodiment, the dynamic bias analog vector-matrix multiplication circuit may further comprise: a controller connected to the programming circuit, by controlling the operation of the programming circuit, the number of programmable semiconductor devices put into operation and the threshold voltage of each programmable semiconductor device are controlled; in addition, the controller can also control the operation according to the demand of the analog vector-matrix multiplication operation.

In an optional embodiment, the dynamic bias analog vector-matrix multiplication circuit may further comprise a row and column decoder, which is used to gate the programmable semiconductor device to be programmed.

In the above embodiments, the programmable semiconductor device may use floating gate transistors.

In the foregoing embodiment, the dynamic bias analog vector-matrix multiplication circuit may further comprise: a bias voltage generating circuit for generating a preset bias voltage and inputting it to the bias voltage input terminal. It shall be understood that, the analog vector-matrix multiplication circuit may also not be provided with a bias voltage generating circuit. By multiplexing the voltage generating circuit in the programming circuit, the voltage generating circuit is controlled to generate a preset bias voltage, which is input to the bias voltage input terminal.

In an optional embodiment, the dynamic bias analog vector-matrix multiplication circuit may further comprise: a conversion device, connected before the multiple analog voltage input terminals, for converting the multiple analog current input signals into analog voltage input signals respectively, and outputting to the corresponding analog voltage input terminal.

Wherein, the conversion device may comprise: a plurality of operational amplifiers and a plurality of programmable semiconductor devices connected to the plurality of operational amplifiers in a one-to-one correspondence. The inverting input terminal of each operational amplifier is connected to the drain of the corresponding programmable semiconductor device, the non-inverting input terminal is connected to the first fixed bias voltage Vd, and the output terminal of the operational amplifier is connected to the source of the programmable semiconductor device and connected to the corresponding analog voltage input terminal, the gate of the programmable semiconductor device is connected to the first fixed bias voltage Vd, and the inverting input terminal of the operational amplifier is used to receive the analog current input signal.

In an alternative embodiment, the dynamic bias analog vector-matrix multiplication circuit may further comprise: a current detection output circuit, connected to the analog current output terminal, for processing and outputting the analog current output signal output by the analog current output terminal.

The current detection output circuit can accurately process and output the calculated current, or receive the input of the next programmable semiconductor array, which can effectively achieve accurate current output.

The current detection output circuit may comprise: a plurality of operational amplifiers, the non-inverting input terminal of each operational amplifier is connected to a second fixed bias Vs, the inverting input terminal is connected to the corresponding analog current output terminal, and a resistor or transistor is connected between the inverting input terminal and the output terminal. Wherein, the second fixed bias is generally a high voltage, and the operational amplifier controls the voltage at the analog current output terminal to be equal to the voltage at the non-inverting input terminal. It is used to ensure that the gate-source voltage of the programmable semiconductor device is only controlled by the input voltage corresponding to the programmable semiconductor device, so that the output terminal voltage of the operational amplifier represents the magnitude of the output current of the programmable semiconductor device of the corresponding column.

The foregoing is only an example to illustrate the specific structure of each module in the analog vector-matrix multiplication circuit provided by the embodiment of the present invention. In specific implementation, the specific structure of the above-mentioned modules is not limited to the above-mentioned structure provided by the embodiment of the present invention, and may also be other structures known to those skilled in the art, which are not limited here.

The embodiment of the application also provides an operation control method of the dynamic bias analog vector-matrix multiplication circuit, which can be used to control the dynamic bias analog vector-matrix multiplication circuit described in the above embodiments, as in the following implementation as mentioned. Since the principle of the arithmetic control method to solve the problem is similar to the above-mentioned circuit, the implementation of the arithmetic control method can refer to the implementation of the above-mentioned circuit, and the repetition will not be repeated.

Figure 5:
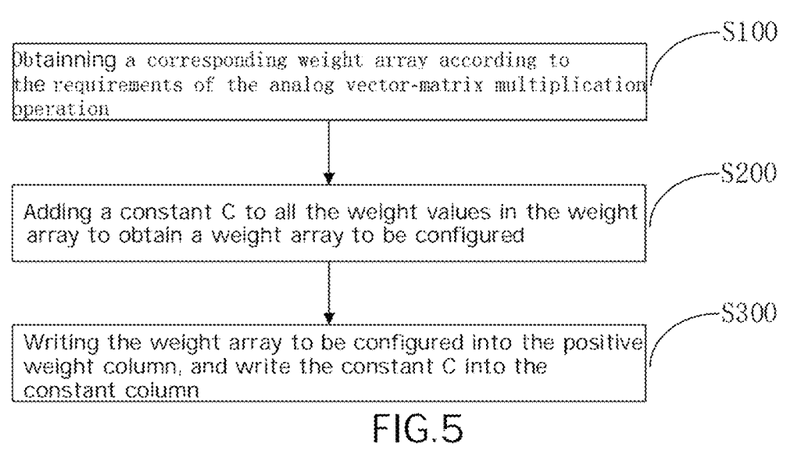
FIG. 5 is an operation control method of a dynamic bias analog vector-matrix multiplication operation circuit according to an embodiment of the present invention.

The flow of the analog vector-matrix multiplication control method is shown in FIG. 5. The analog vector-matrix multiplication control method is applied to the above-mentioned dynamic bias analog vector-matrix multiplication circuit, and specifically comprises the following steps:

Step S100: Obtaining a corresponding weight array according to the requirements of the analog vector-matrix multiplication operation, the weight array comprising negative weights and positive weights.

Wherein, the weight array can be obtained by extracting the weight corresponding to each item from the simulation vector-matrix multiplication operation requirement.

Step S200: Adding a constant C to all the weight values in the weight array to obtain a weight array to be configured, wherein the constant C is greater than or equal to the absolute value of the negative weight with the largest absolute value.

Step S300: Writing the weight array to be configured into the positive weight column, and writing the constant C into the constant column.

It can be known from the above technical solutions that the present invention provides a dynamic bias analog vector-matrix multiplication circuit operation control method, before writing the weight to the programmable semiconductor device, adding a constant positive value to each element in the weight array to get the weight array to be configured, the positive value of the constant is greater than or equal to the absolute value of the negative weight with the largest absolute value in the weight array, so that there is no negative weight in the weight array to be configured, and the weight array to be configured is written into the positive weight column, writing the positive constant value into the constant column. The minuend input terminal of a subtractor is correspondingly connected to the output terminal of a positive weight column, the subtrahend input terminal is connected to the output terminal of a constant column, and the output terminal outputs the result of the analog vector-matrix multiplication operation. Therefore, the effect of the positive value of the constant is subtracted from the result of the operation by the subtractor. In this way, there is no need to set a negative weight column, and multiple positive weight columns share a constant column, which can simplify the circuit structure, effectively reduce the number of components, reduce the circuit area, reduce cost, and facilitate integration.

In another embodiment, when there are multiple constant columns of the dynamic bias analog vector-matrix multiplication circuit, the operation control method comprises the following steps:

Step 1: Obtaining a corresponding weight array according to the requirements of the analog vector-matrix multiplication operation, and the weight array comprises negative weights and positive weights.

Step 2: Splitting the corresponding weight array obtained according to the requirements of the analog vector-matrix multiplication operation into multiple weight sub-arrays by column;

Step 3: For each weight sub-array, adding a constant to all the weight values in the weight sub-array to obtain the weight sub-array to be configured, wherein, the constant is greater than or equal to the absolute value of the negative weight with the largest absolute value in the weight sub-array.

Step S300: For each weight sub-array, writing the weight sub-array to be configured into the positive weight column, and writing the corresponding constant into the constant column corresponding to the positive weight column.

It can be seen from the above technical solution that the operation control method of the dynamic bias analog vector-matrix multiplication circuit provided by the present invention not only does not need to set a negative weight column, can simplify the circuit structure, but also can reduce the influence of parasitic parameters and improve the driving ability. In addition, the calculation can be realized more flexibly, and the parallel processing of multiple calculation tasks can also be realized, which can effectively improve the calculation speed and efficiency.

On the other hand, an embodiment of the present invention also provides a chip, which comprises the above-mentioned dynamic bias analog vector-matrix multiplication circuit.

In addition, an embodiment of the present invention also provides an electronic device. The electronic device may comprise the above-mentioned dynamic bias analog vector-matrix multiplication circuit. Specifically, the electronic device may be, for example, a personal computer, a laptop computer, a cellular phone, camera phones, smart phones, personal digital assistants, media players, navigation devices, email devices, game consoles, tablet computers, wearable devices, or any combination of these devices.

In addition, according to an embodiment of the present invention, the above operation control method can be implemented as a computer software program. For example, an embodiment of the present invention comprises a computer program product, which comprises a computer program tangibly embodied on a machine-readable medium, and the computer program comprises program code for executing the method shown in the flowchart. In such an embodiment, the computer program may be downloaded and installed from the network through the communication part, and/or installed from a removable medium.

Computer-readable media comprise permanent and non-permanent, removable and non-removable media, and information storage can be realized by any method or technology. The information can be computer-readable instructions, data structures, program modules, or other data. Examples of computer storage media comprise, but are not limited to, phase change memory (PRAM), static random access memory (SRAM), dynamic random access memory (DRAM), other types of random access memory (RAM), read-only memory (ROM), electrically erasable programmable read-only memory (EEPROM), flash memory or other memory technology, (CD-ROM), digital versatile disc (DVD) or other optical storage, Magnetic cassettes, magnetic tape storage or other magnetic storage devices or any other non-transmission media can be used to store information that can be accessed by computing devices. According to the definition in this article, computer-readable media does not comprise transitory media, such as modulated data signals and carrier waves.

It should also be noted that the terms "comprise", "include" or any other variants thereof are intended to cover non-exclusive inclusion, so that a process, method, commodity or equipment comprising a series of elements not only comprises those elements, but also comprises other elements that are not explicitly listed, or they also comprise elements inherent to such processes, methods, commodities, or equipment. If there are no more restrictions, the element defined by the sentence "comprising a . . . " does not exclude the existence of other identical elements in the process, method, commodity, or equipment that comprises the element.

In the present invention, specific examples are used to illustrate the principles and implementation of the present invention. The descriptions of the above examples are only used to help understand the method and core idea of the present invention; at the same time, for those of ordinary skill in the art, according to this The idea of the invention will have changes in the specific implementation and the scope of application. In summary, the content of this specification should not be construed as limiting the invention.

What is claimed is:

1. A dynamic bias analog vector-matrix multiplication circuit, characterized by comprising: a programmable semiconductor device array and subtractors;
   the programmable semiconductor device array comprising: positive weight columns and constant columns, the number of the subtractors is equal to the number of positive weight columns and both are connected in one-to-one correspondence, and the number of constant columns is less than the number of positive weight columns;
   the constant columns can be one column or duplicate columns;
   a minuend input terminal of each subtractor is connected to an output terminal of a corresponding positive weight column, a subtrahend input terminal of each subtractor is connected to an output terminal of a corresponding constant column, and an output terminal of each subtractor outputs a calculation result;
   the subtrahend inputs of multiple subtractors are connected to the same constant column.

2. The dynamic bias analog vector-matrix multiplication circuit according to claim 1, further comprising:
   the programmable semiconductor device array includes a plurality of programmable semiconductor devices, each including a source, a gate and a substrate;
   a programming circuit connected to the source, the gate and/or the substrate of each programmable semiconductor device in the programmable semiconductor device array, and is used to adjust a threshold voltage of the programmable semiconductor device.

3. The dynamic bias analog vector-matrix multiplication circuit according to claim 2, wherein the programming circuit comprises: a voltage generating circuit and a voltage control circuit, the voltage generating circuit is used to generate a programming voltage or an erasing voltage, the voltage control circuit is used to load the programming voltage to the source of a selected programmable semiconductor device, or to load the erase voltage to the gate or the substrate of the selected programmable semiconductor device to control the threshold voltage of the programmable semiconductor device.

4. The dynamic bias analog vector-matrix multiplication circuit according to claim 2, further comprising:
   a controller connected to the programming circuit, and controlling the number of programmable semiconductor devices put into operation and the threshold voltage of each programmable semiconductor device by controlling the operation of the programming circuit.

5. The dynamic bias analog vector-matrix multiplication circuit according to claim 1, further comprising: a row and column decoder for gating the programmable semiconductor device to be programmed.

6. The dynamic bias analog vector-matrix multiplication circuit according to claim 1, wherein the programmable semiconductor device adopts a floating gate transistor.

7. An analog vector-matrix multiplication operation control method, wherein it is applied to the dynamic bias analog vector-matrix multiplication operation circuit according to claim 1, and the operation control method comprises:
   obtaining a corresponding weight array according to the requirements of a simulated vector-matrix multiplication operation, where the weight array comprises negative weights and positive weights;
   adding a constant C to all the weight values in the weight array to obtain a weight array to be configured, wherein the constant C is greater than or equal to the absolute value of the negative weight with the largest absolute value;
   writing the weight array to be configured into the positive weight columns, and writing the constant C into the constant columns.

* * * * *